(12) United States Patent
Tentinger

(10) Patent No.: US 11,708,173 B2
(45) Date of Patent: Jul. 25, 2023

(54) AVIONIC SLIDING RACK

(71) Applicant: Bell Textron Inc., Fort Worth, TX (US)

(72) Inventor: Mark Tentinger, Fort Worth, TX (US)

(73) Assignee: Textron Innovations Inc., Providence, RI (US)

( * ) Notice: Subject to any disclaimer, the term of this patent is extended or adjusted under 35 U.S.C. 154(b) by 936 days.

(21) Appl. No.: 16/536,086

(22) Filed: Aug. 8, 2019

(65) Prior Publication Data

US 2021/0039805 A1 Feb. 11, 2021

(51) Int. Cl.
*B64D 43/00* (2006.01)
*H05K 7/14* (2006.01)

(52) U.S. Cl.
CPC ........... *B64D 43/00* (2013.01); *H05K 7/1412* (2013.01)

(58) Field of Classification Search
CPC ......... B64D 43/00; H05K 7/18; H05K 7/1412
See application file for complete search history.

(56) References Cited

U.S. PATENT DOCUMENTS

| | | |
|---|---|---|
| 3,143,981 A | 8/1964 | Tassell |
| 3,462,110 A | 8/1969 | Cheslock |
| 4,021,973 A | 5/1977 | Hegg et al. |
| 4,163,537 A | 8/1979 | Mourgue |
| 4,295,588 A * | 10/1981 | Kowalski ................. B60R 9/045 224/325 |
| 5,192,145 A | 3/1993 | Rixen et al. |
| 5,481,842 A | 1/1996 | Gautreau |
| 5,979,119 A | 11/1999 | Trafton |
| 6,712,543 B1 | 3/2004 | Schmalzhofer |
| 7,032,862 B2 * | 4/2006 | Landes ................. B64D 43/00 244/129.1 |
| 7,178,765 B2 | 2/2007 | Huang |
| 7,389,621 B2 | 6/2008 | Hawes |
| 7,600,349 B2 | 10/2009 | Liebendorfer |
| 7,748,175 B2 | 7/2010 | Liebendorfer |

(Continued)

FOREIGN PATENT DOCUMENTS

CN 207438123 U 6/2018

OTHER PUBLICATIONS

Prepared by direction of the Interdepartmental Screw-Thread Committee, "1950 Supplement to Screw-thread Standards for Federal Services, 1944," 1951, United States, U.S. Government Printing Office, pp. 2-3, 51 (Year: 1951).*

(Continued)

*Primary Examiner* — William Lu
(74) *Attorney, Agent, or Firm* — Bradley Arant Boult Cummings LLP

(57) ABSTRACT

A mounting rail system for a console of an aircraft includes a pair of mounting rails. The first mounting rail is secured to the console and includes a first track with a pair of threaded faces that are configured to receive a first fastener. The second mounting rail is secured to the console opposite the first mounting rail and includes a second track with a pair of threaded faces that are configured to receive a second fastener. The mounting rail system includes a first mounting bracket configured to be secured to the first mounting rail via the first fastener and a second mounting bracket configured to be secured to the second mounting rail via the second fastener.

17 Claims, 3 Drawing Sheets

(56) References Cited

U.S. PATENT DOCUMENTS

| | | | | |
|---|---|---|---|---|
| 7,784,738 | B1* | 8/2010 | Landes | H05K 7/18 |
| | | | | 244/129.4 |
| 8,132,772 | B1 | 3/2012 | Thomas et al. | |
| 8,640,400 | B2 | 2/2014 | Liebendorfer | |
| 8,695,290 | B1 | 4/2014 | Kim et al. | |
| 9,022,712 | B2 | 5/2015 | Klopfenstein, II | |
| 9,212,675 | B2 | 12/2015 | Oetlinger | |
| 9,584,062 | B2 | 2/2017 | Ganshaw et al. | |
| 9,732,780 | B2 | 8/2017 | Anderson et al. | |
| 10,433,450 | B2 | 10/2019 | Kinard et al. | |
| 2003/0105465 | A1* | 6/2003 | Schmieding | A61F 2/0811 |
| | | | | 606/907 |
| 2003/0183730 | A1* | 10/2003 | Landes | B64D 43/00 |
| | | | | 248/27.1 |
| 2004/0018341 | A1* | 1/2004 | Richardson | B62D 29/04 |
| | | | | 428/138 |
| 2004/0026679 | A1* | 2/2004 | Terrels | E04H 17/1439 |
| | | | | 256/65.03 |
| 2005/0082862 | A1* | 4/2005 | Anderson | E05B 83/32 |
| | | | | 296/37.7 |
| 2007/0125016 | A1* | 6/2007 | Yu | E04B 2/7425 |
| | | | | 52/220.7 |
| 2008/0213112 | A1* | 9/2008 | Lucas | F04B 53/166 |
| | | | | 417/471 |
| 2008/0266779 | A1* | 10/2008 | Thomas | G06F 1/187 |
| | | | | 361/679.34 |
| 2009/0282755 | A1* | 11/2009 | Abbott | F16B 5/0635 |
| | | | | 52/173.3 |
| 2010/0294906 | A1 | 11/2010 | Klepack et al. | |
| 2011/0000526 | A1 | 1/2011 | West | |
| 2011/0110055 | A1* | 5/2011 | Philips | G02B 6/426 |
| | | | | 361/756 |
| 2011/0169386 | A1* | 7/2011 | Hardy | A47B 96/067 |
| | | | | 312/246 |
| 2011/0215203 | A1 | 9/2011 | Rose et al. | |
| 2012/0175479 | A1 | 7/2012 | Graham et al. | |
| 2012/0241703 | A1* | 9/2012 | Regan | E04F 11/181 |
| | | | | 248/539 |
| 2014/0152492 | A1* | 6/2014 | Zimmerman | H01Q 1/08 |
| | | | | 29/601 |
| 2014/0222283 | A1* | 8/2014 | Getman | F28G 15/04 |
| | | | | 134/56 R |
| 2015/0334868 | A1* | 11/2015 | Fricker | H05K 7/1489 |
| | | | | 361/727 |
| 2016/0335836 | A1* | 11/2016 | Castro | F16M 11/041 |
| 2017/0259701 | A1* | 9/2017 | Supernavage | B60N 2/30 |
| 2018/0098452 | A1* | 4/2018 | Baker | H05K 7/183 |

OTHER PUBLICATIONS

Radiorax, "Radiorax 2009 Catalog, The avionics mounting standard," URL:<http://www.radiorax.com/documents/catalog.php?document=radiorax_catalog&name=Radiorax%20Kit%20Catalog>, Retrieved: Apr. 3, 2019.

Tanguay, Julien, et al.; U.S. Appl. No. 16/374,967, filed Apr. 4, 2019; 32 pages.

* cited by examiner

AVIONIC SLIDING RACK

BACKGROUND

This section provides background information to facilitate a better understanding of the various aspects of the disclosure. It should be understood that the statements in this section of this document are to be read in this light, and not as admissions of prior art.

Modern aircraft incorporate various avionics equipment for use by a pilot and co-pilot. Avionics equipment includes equipment such as radios, navigational equipment, control systems, and the like. The avionics equipment are typically mounted to a dash or console of the aircraft and are positioned to be accessible by the pilot and/or co-pilot. Depending on the purpose of a particular aircraft, different avionics equipment may be desired. To allow for different avionics equipment to be easily fitted to an aircraft, the console typically includes a plurality of mounting holes spaced along a length of the console. While the spaced mounting holes offer some placement flexibility, the pre-set bolt holes can prevent the avionics equipment from being mounted as precisely as may be desired. To overcome the limitations associated with pre-set mounting holes, a mounting rail system can be used.

SUMMARY

An example of a mounting rail system for a console of an aircraft includes a mounting rail comprising a track with two threaded faces and a mounting bracket configured to be secured to the mounting rail via a fastener that engages threads of the two threaded faces. In some aspects, the two threaded faces are configured to engage the fastener with an interference fit.

An example of a mounting rail for a console of an aircraft includes a track disposed along a length of the mounting rail, a pair of threaded faces disposed on opposites sides of the track and configured to receive a fastener, and a slot formed into a face of the mounting rail.

An example of a mounting rail system for a console of an aircraft includes a pair of mounting rails. The first mounting rail is secured to the console and includes a first track with a pair of threaded faces that are configured to receive a first fastener. The second mounting rail is secured to the console opposite the first mounting rail and includes a second track with a pair of threaded faces that are configured to receive a second fastener. The mounting rail system includes a first mounting bracket configured to be secured to the first mounting rail via the first fastener and a second mounting bracket configured to be secured to the second mounting rail via the second fastener.

This summary is provided to introduce a selection of concepts that are further described below in the detailed description. This summary is not intended to identify key or essential features of the claimed subject matter, nor is it intended to be used as an aid in limiting the scope of claimed subject matter.

BRIEF DESCRIPTION OF THE DRAWINGS

The disclosure is best understood from the following detailed description when read with the accompanying figures. It is emphasized that, in accordance with standard practice in the industry, various features are not drawn to scale. In fact, the dimensions of various features may be arbitrarily increased or reduced for clarity of discussion.

DETAILED DESCRIPTION

Figure 1:
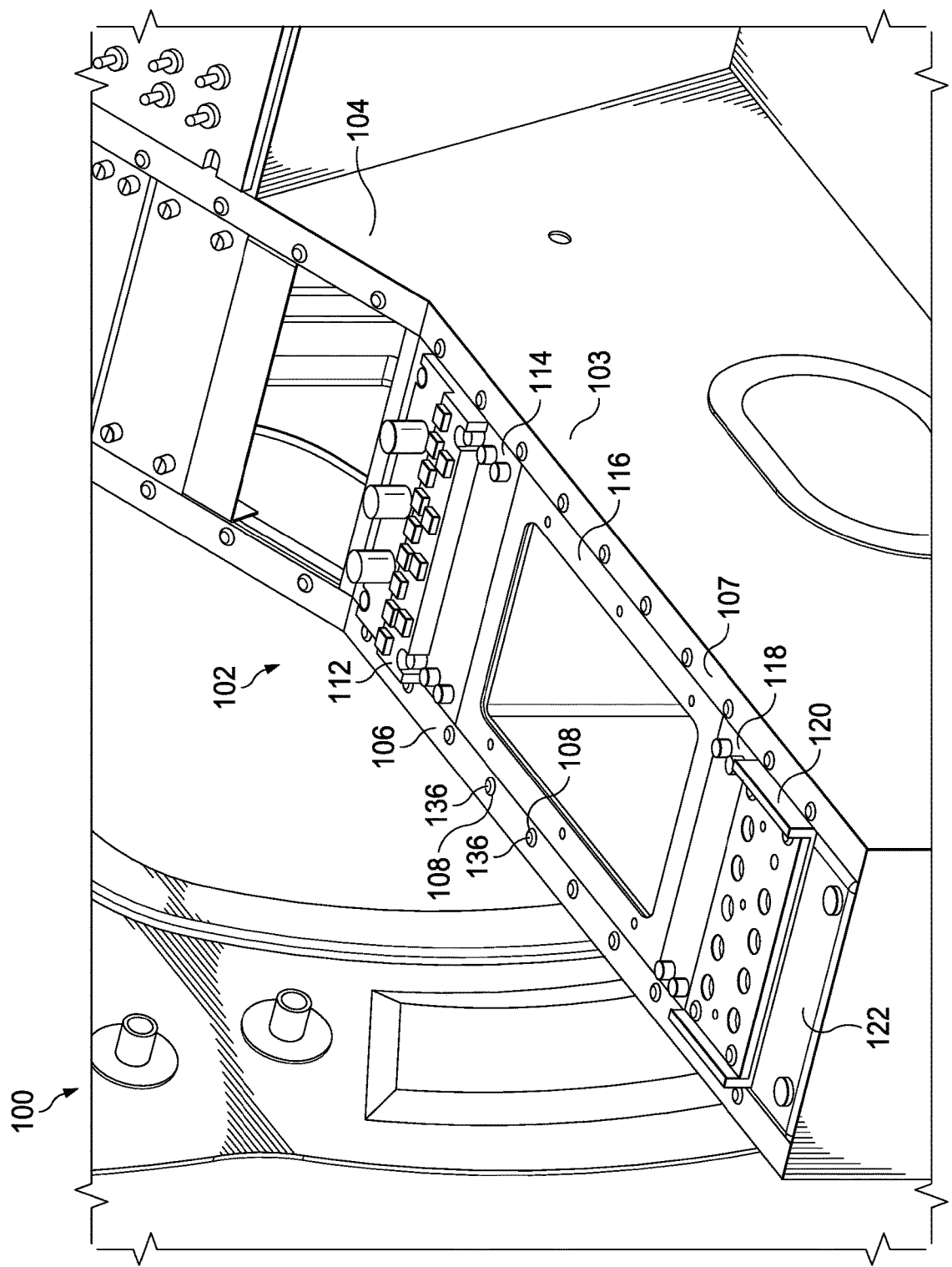
FIG. 1 is a partial view of an illustrative cockpit of an aircraft according to aspects of the disclosure.

It is to be understood that the following disclosure provides many different embodiments, or examples, for implementing different features of various embodiments. Specific examples of components and arrangements are described below to simplify the disclosure. These are, of course, merely examples and are not intended to be limiting. In addition, the disclosure may repeat reference numerals and/or letters in the various examples. This repetition is for the purpose of simplicity and clarity and does not in itself dictate a relationship between the various embodiments and/or configurations discussed.

In the specification, reference may be made to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

FIG. 1 is a partial view of an illustrative cockpit 100 of an aircraft according to aspects of the disclosure. Cockpit 100 includes a pedestal or console 102 to which various avionics equipment may be secured. Console 102 includes an upper portion 103 and a lower portion 104. Each of the upper and lower portions 103, 104 include openings to receive the avionics equipment and flanges 106, 107 positioned on opposite sides of the openings. Console 102 is illustrated with a single opening between a single pair of flanges 106, 107. In other aspects, the opening of console 102 may be subdivided down the middle into two or more openings with each opening including a pair of flanges 106, 107. Each flange 106, 107 includes a plurality of bolt holes 108 to facilitate mounting of the avionics equipment. Typically, each bolt hole 108 of the plurality of bolt holes 108 is spaced apart from adjacent bolt holes 108 at regular intervals (e.g., every ⅜ of an inch). While the plurality of bolt holes 108 offer a variety of mounting options, it is often preferable to have even greater flexibility regarding the exact placement of avionics equipment. To provide that flexibility, a mounting rail system 110 (best seen in FIGS. 2 and 3) with variable mounting points can be used with console 102. For illustrative purposes, FIG. 1 shows various components secured to lower portion 104 via mounting rail system 110, including: a first avionics device 112, a blanking plate 114, a spacer 116, a blanking plate 118, a plate 120, and a second avionics device 122.

Figure 2:
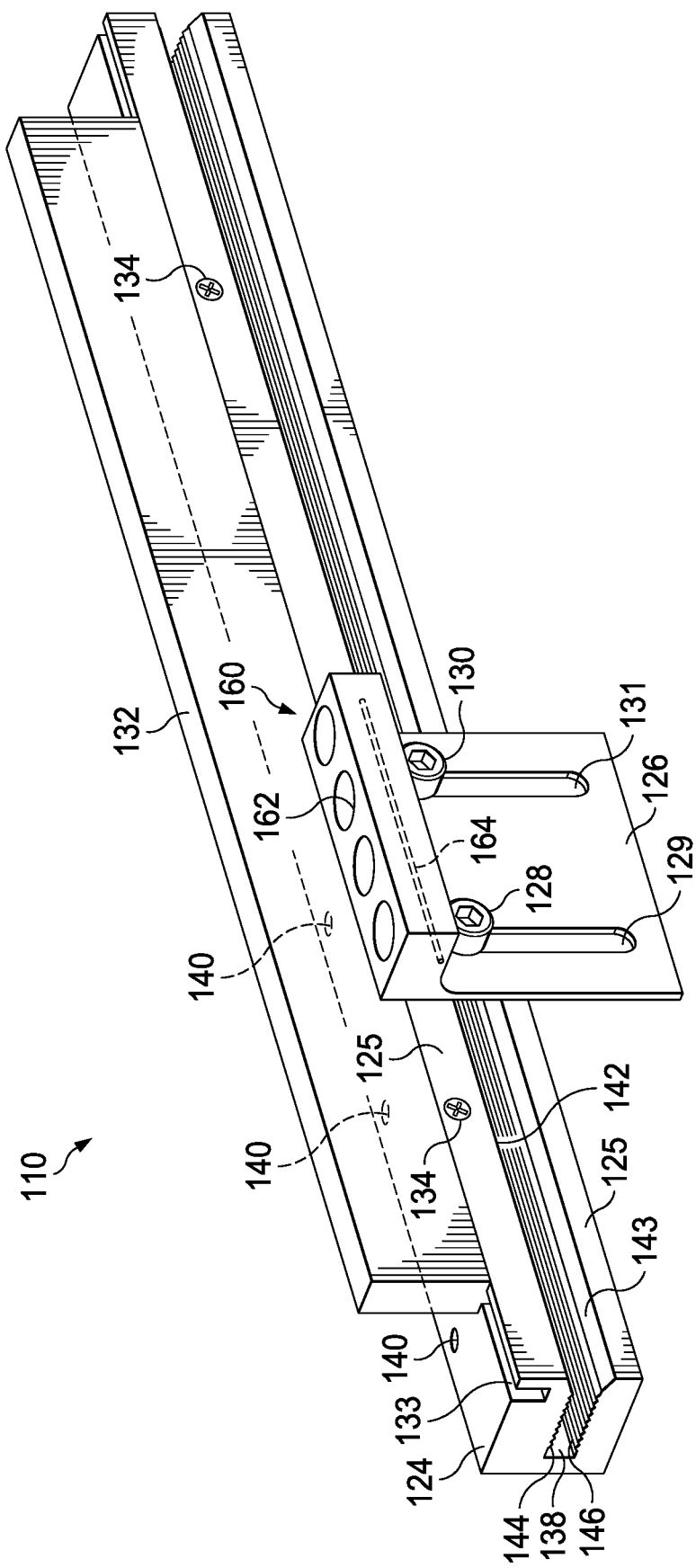
FIG. 2 is a perspective view of a railing system for an aircraft according to aspects of the disclosure.
Figure 3:
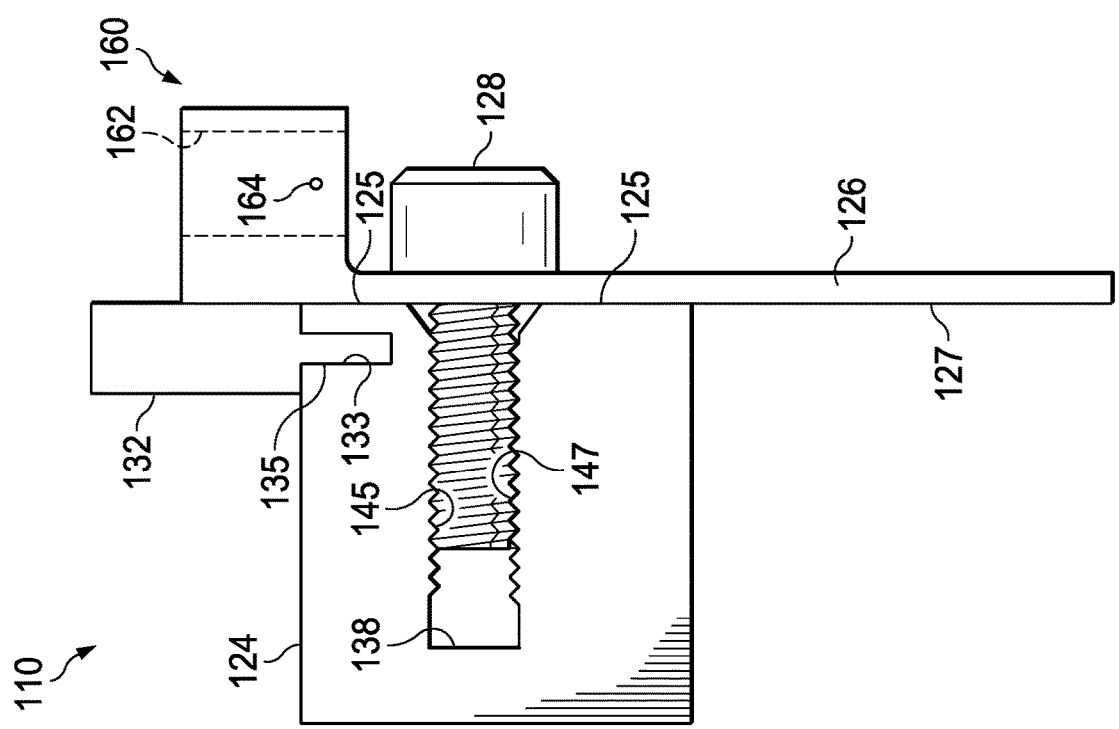
FIG. 3 is a side view of a railing system for an aircraft according to aspects of the disclosure.

Referring now to FIGS. 2 and 3, a single mounting rail 124 of mounting rail system 110 is illustrated according to aspects of the disclosure. FIG. 2 is a perspective view of mounting rail 124 and FIG. 3 is a side view of mounting rail 124. Mounting rail system 110 includes two mounting rails 124, one of which attaches to flange 106 and a second of which attaches to flange 107. The two mounting rails 124 are mirrors of each other. A single mounting rail 124 will be discussed with the understanding that the discussion thereof also applies to the other of the two mounting rails.

In addition to mounting rail 124, mounting rail system 110 includes a mounting bracket 126 that attaches to mounting rail 124 via fasteners 128 and 130. Mounting rail 124 optionally includes a spacer 132. Spacer 132 improves aesthetics by filling gaps that would exist between equipment attached to mounting rail 124 and console 102. Spacer 132 can come in a variety of lengths and widths to match up with a variety of components. As illustrated in FIGS. 2 and 3, spacer 132 includes a tab 135 that fits into a slot 133 formed into a top face of mounting rail 124. Spacer 132 can be secured to mounting rail 124 via fasteners 134. In various aspects, spacers 132 having different thicknesses may be used to ensure that the component being mounted is properly fitted to console 102. In some aspects, spacer 132 may be integrally formed with mounting rail 124. For example, spacer 132 and mounting rail 124 may be formed from the same material and as a single part.

Spacer 132 is designed so that spacer 132 is not positioned between mounting bracket 126 and mounting rail 124. This allows faces 125 of mounting rail 124 to directly contact a face 127 of mounting bracket 126. Direct contact between faces 125 and face 127 improves grounding between the component attached to mounting bracket 126 and mounting rail 124 to provide an adequate bonding path for fault current. If spacer 132 was positioned between mounting rail 124 and mounting bracket 126, the grounding path could bottleneck from the component being mounted through fasteners 128, 130. In some instances, such a grounding path is sufficient. However, some sensitive components require grounding paths with less resistance.

Mounting rail 124 includes a plurality of bolt holes 140 (best seen in FIG. 2) positioned along a length of mounting rail 124 that coincide with the plurality of bolt holes 108. Mounting rail 124 is secured to flange 106 via fasteners 136 and includes a track 138 that is configured to receive fasteners 128 and 130. An opening of track 138 includes bevelled faces 142, 143 that make it easier to insert fasteners 128 and 130 into track 138. Track 138 also includes threaded faces 144, 146. Each face of threaded faces 144, 146 includes threads 145, 147, respectively, that are configured to engage threads of fasteners 128 and 130. Threads 145, 147 mimic the threads of a standard nut but arranged along a continuous planar face instead of along a circular or cylindrical face. Threads 145, 147 can be conceptualized as having the configuration of a threaded nut that has been cut in half across its diameter, with the top half of the threaded nut flattened into threads 145 and the bottom half of the threaded nut flattened into threads 147. This configuration of track 138 eliminates the need for a nut to be placed into track 138, which reduces part count and simplifies installation. Track 138 also allows for fasteners 128, 130 to be inserted at any point along the length of track 138, which allows for maximum placement flexibility for any components attached to mounting rail system 110. Threaded faces 144, 146 can be created using various machining techniques including electrical discharge machining (e.g., wire EDM).

In some aspects, threads 145, 147 are sized so that the fit between fasteners 128, 130 and threads 145, 147, respectively, is an interference fit. Using an interference fit helps to improve retention of fasteners 128, 130 within track 138. For example, fasteners 128, 130 are inserted into track 138 and torqued until the normal surface of the fastener head is secured against mounting bracket 126, which securely sets the orientation of fasteners 128, 130 to prevent tilting or sliding of fasteners 128, 130 within track 138. The normal force to the heads of fasteners 128, 130, combined with the frictional and normal forces against the threads of fasteners 128, 130, secures the position of fasteners 128, 130, and thus the position of mounting bracket 126 so that mounting bracket 126 can bear load (i.e., support the weight of avionics control panels).

Mounting bracket 126 is secured to mounting rail 124 via fasteners 128, 130. Mounting bracket 126 includes slots 129, 131 through which fasteners 128, 130 pass. Slots 129, 131 allow a height of mounting bracket 126, and thus a height of the component secured thereto, to be set as desired. In some aspects, slots 129, 131 may be replaced with holes to provide a mounting bracket 126 having a fixed height. In some aspects, slots 129, 131 may be replaced with multiple holes are different heights to provide some flexibility regarding a height of mounting bracket 126.

In some aspects, mounting bracket 126 includes a DZUS® rail 160 that includes a plurality of holes 162 with a mounting wire 164 passing therethrough. A DZUS® rail is a part of a standardized, quick fastening system that works with quarter-turn fasteners to allow for quick and secure coupling of components. For example, FIG. 1 illustrates components 112-122 so secured to console 102. In some aspects, the plurality of holes 162 may be threaded bores that receive standard screws or non-threaded bores that receive bolts.

Figure 4:
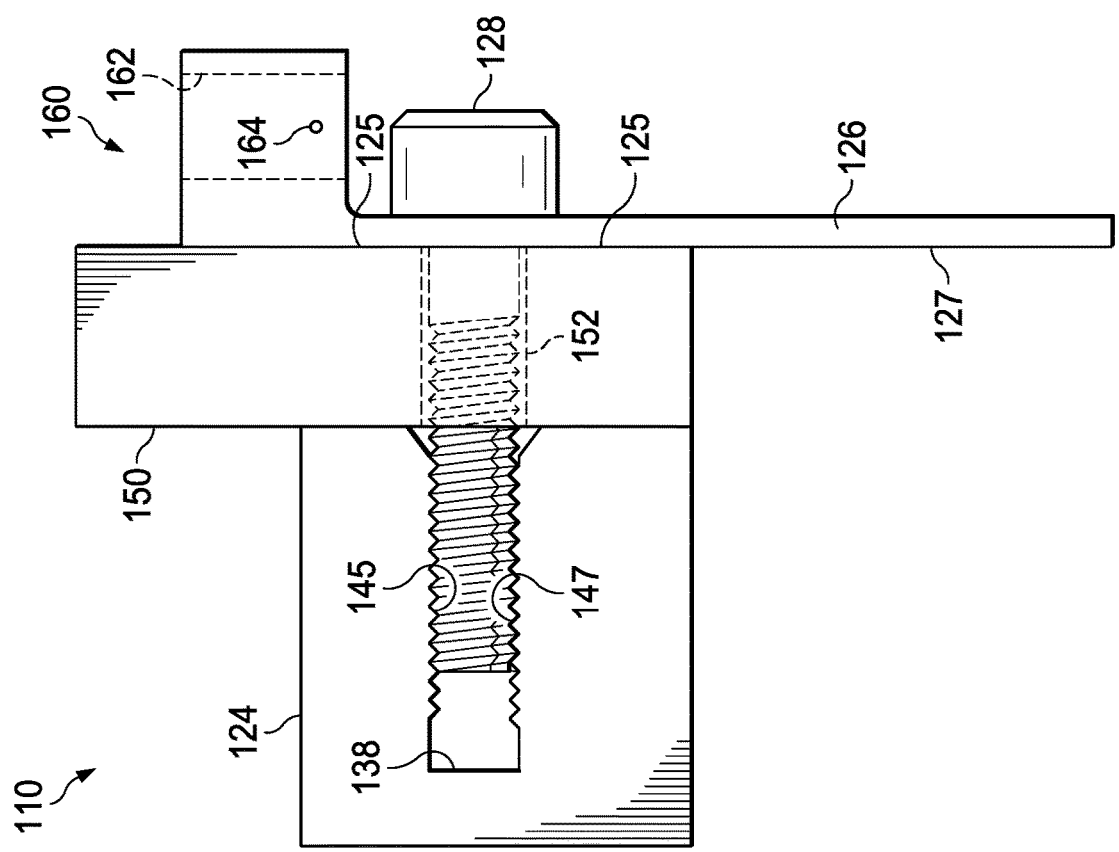
FIG. 4 is a side view of a railing system for an aircraft according to aspects of the disclosure.

FIG. 4 is a side view of mounting rail system 110 with a spacer 150 inserted between mounting rail 124 and mounting bracket 126. In the aspect illustrated in FIG. 4, spacer 132 has been replaced with spacer 150. Spacer 150 serves a similar purpose as spacer 132, but, in contrast to spacer 132 that mounts to a top surface of mounting rail 124, spacer 150 is instead positioned between mounting rail 124 and mounting bracket 126. Spacer 150 includes holes 152 through which fasteners 128, 130 may pass to secure spacer 150 to mounting rail 124. In some aspects, spacer 150 is made from a metallic material and forms a part of the grounding path between faces 125, 127. In some aspects, spacer 150 is made from non-metallic materials. Dimensions of spacer 150 (e.g., length, width, and height) may be varied to suit particular mounting configurations to provide a desired fitment for the component being mounted to console 102. In some aspects, spacer 150 may be integrally formed with mounting bracket 126. For example, spacer 150 and mounting bracket 126 may be formed from the same material and as a single part.

The term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," "generally," and "about" may be substituted with "within [a percentage] of" what is specified, as understood by a person of ordinary skill in the art. For example, within 1%, 2%, 3%, 5%, and 10% of what is specified herein.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the disclosure, and that they may make various changes, substitutions and alterations herein without departing from the spirit and scope of the disclosure. The scope of the invention should be determined only by the language of the claims that follow. The term "comprising" within the claims is intended to mean "including at least" such that the recited listing of elements in a claim are an open group. The terms "a," "an" and other singular terms are intended to include the plural forms thereof unless specifically excluded.

What is claimed is:

1. A mounting rail system for a console of an aircraft, the mounting rail system comprising:
   a mounting rail comprising a track with two threaded faces and a slot formed into a top face of the mounting rail;
   a mounting bracket configured to be secured to the mounting rail via a fastener that engages threads of the two threaded faces; and
   a spacer comprising a tab that fits into the slot;
   wherein the two threaded faces are configured to engage the fastener with an interference fit.

2. The mounting rail system of claim 1, wherein the spacer is configured to be positioned between a component secured to the mounting bracket and the console.

3. The mounting rail system of claim 2, wherein a face of the mounting bracket contacts a face of the mounting rail.

4. The mounting rail system of claim 2, wherein the spacer is secured to the mounting rail via fasteners that pass through the tab of the spacer.

5. The mounting rail system of claim 1, wherein the mounting bracket comprises a slot to allow a height of the mounting bracket relative to the mounting rail to be adjusted.

6. The mounting rail system of claim 1, wherein the mounting rail comprises a plurality of holes that align with a plurality of holes of the console.

7. The mounting rail system of claim 1, wherein an opening of the track comprises a pair of bevelled faces.

8. A mounting rail for a console of an aircraft, the mounting rail comprising:
   a track formed along a length of the mounting rail;
   a pair of threaded faces disposed on opposites sides of the track and configured to receive a fastener, wherein the pair of threaded faces are configured to engage the fastener with an interference fit; and
   a slot formed into a face of the mounting rail, wherein a spacer comprising a tab is configured to fit within the slot to attach the spacer to the mounting rail.

9. The mounting rail of claim 8, comprising a mounting bracket configured to be secured to the mounting rail via the fastener.

10. The mounting rail of claim 9, wherein the mounting bracket comprises a slot to allow a height of the mounting bracket relative to the mounting rail to be adjusted.

11. A mounting rail system for a console, the mounting rail system comprising:
    a first mounting rail secured to the console and comprising a slot formed into a top face of the first mounting rail and a first track, the first track comprising a pair of threaded faces that are configured to receive a first fastener, wherein the pair of threaded faces of the first mounting rail are configured to engage the first fastener with an interference fit;
    a spacer comprising a tab that fits into the slot;
    a second mounting rail secured to the console opposite the first mounting rail and comprising a second track, the second track comprising a pair of threaded faces that are configured to receive a second fastener, wherein the pair of threaded faces of the second mounting rail are configured to engage the second fastener with an interference fit;
    a first mounting bracket configured to be secured to the first mounting rail via the first fastener; and
    a second mounting bracket configured to be secured to the second mounting rail via the second fastener.

12. The mounting rail system of claim 11, wherein the spacer is configured to be positioned between a component secured to the first mounting bracket and the console.

13. The mounting rail system of claim 12, wherein a face of the first mounting bracket contacts a face of the first mounting rail.

14. The mounting rail system of claim 12, wherein the spacer is secured to the first mounting rail via fasteners that pass through the tab of the spacer.

15. The mounting rail system of claim 11, wherein the first mounting bracket comprises a slot to allow a height of the first mounting bracket relative to the first mounting rail to be adjusted.

16. The mounting rail system of claim 11, wherein the first mounting rail comprises a plurality of holes that align with a plurality of holes of the console.

17. The mounting rail system of claim 11, wherein an opening of the first track comprises a pair of bevelled faces.

* * * * *